United States Patent [19]
Palmieri et al.

[11] Patent Number: 5,605,851
[45] Date of Patent: Feb. 25, 1997

[54] METHOD OF FORMING SEMICONDUCTOR DEVICE WITH A BURIED JUNCTION

[75] Inventors: Michele Palmieri, Settimo Milanese; Riccardo Depetro, Domodossola, both of Italy

[73] Assignee: SGS-Thomson Microelectronics S.r.l., Agrate Brianza, Italy

[21] Appl. No.: 414,120

[22] Filed: Mar. 31, 1995

[30]  Foreign Application Priority Data

Mar. 31, 1994 [EP] European Pat. Off. ............ 94830160

[51] Int. Cl.$^6$ ............................................. H01L 21/8228
[52] U.S. Cl. ................. 437/33; 437/59; 437/149
[58] Field of Search ................... 437/33, 34, 56, 437/57, 58, 59, 149, 150, 151; 148/DIG. 9, DIG. 151

[56]  References Cited

U.S. PATENT DOCUMENTS

| | | | |
|---|---|---|---|
| 4,283,236 | 8/1981 | Sirsi | 437/149 |
| 4,536,945 | 8/1985 | Gray et al. | 437/59 |
| 5,028,557 | 7/1991 | Tsai et al. | 437/59 |
| 5,208,171 | 5/1993 | Ohmi | 437/34 |
| 5,290,714 | 3/1994 | Onozawa | 437/34 |

FOREIGN PATENT DOCUMENTS

| | | |
|---|---|---|
| 0006119 | 1/1980 | European Pat. Off. . |
| 0160919 | 11/1985 | European Pat. Off. . |
| 0231811 | 8/1987 | European Pat. Off. . |
| 0250869 | 1/1988 | European Pat. Off. . |
| 0521802A2 | 1/1993 | European Pat. Off. . |
| 2753704 | 6/1979 | Germany . |
| 60-088455 | 5/1985 | Japan . |

Primary Examiner—Chandra Chaudhari
Attorney, Agent, or Firm—Seed and Berry LLP; David V. Carlson; Harry K. Ahn

[57]  ABSTRACT

A method is disclosed for forming a first region with conductivity of a first type and second, buried region with conductivity of a second type which forms a junction with the first region. By first and second doping steps, impurities of a first and a second type are successively introduced into a silicon chip. A high-temperature treatment causes the impurities thus introduced to diffuse and form said first and second regions. In order to provide a buried region whose concentration and/or depth are little dependent on process parameters, the second doping step comprises a first sub-step of low dosage and high energy implantation, and a second sub-step of low dosage and high energy implantation. The dosages and energies are such that they will not compensate or reverse the type of conductivity of the first region, and such that the concentration in the second region will be substantially due to the second implantation step only.

13 Claims, 3 Drawing Sheets

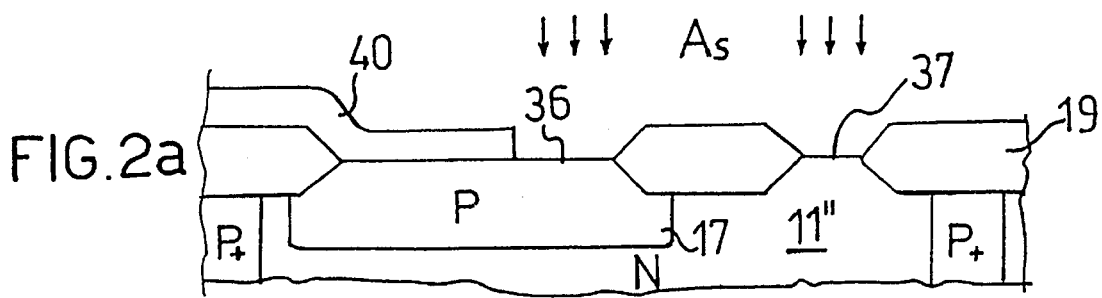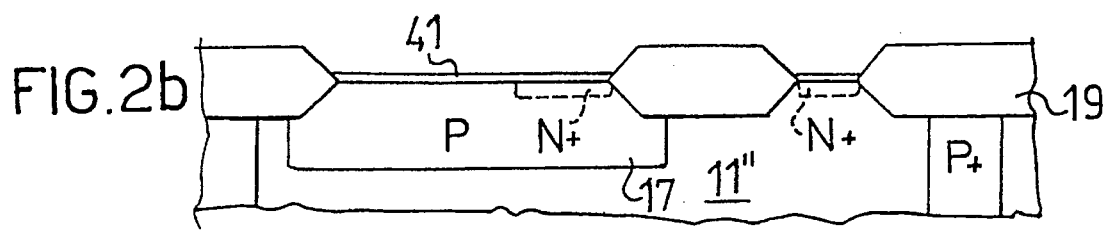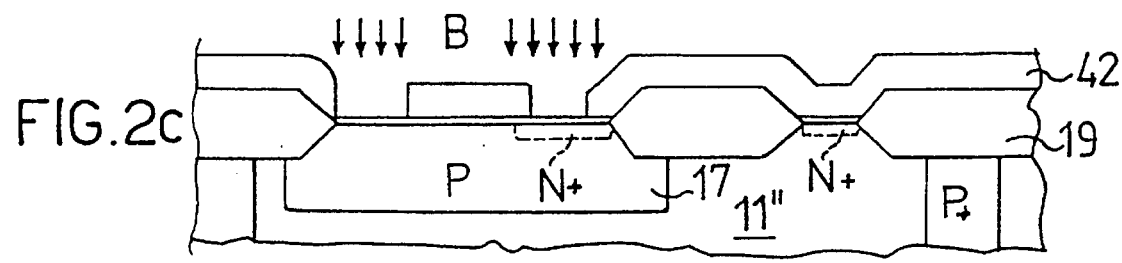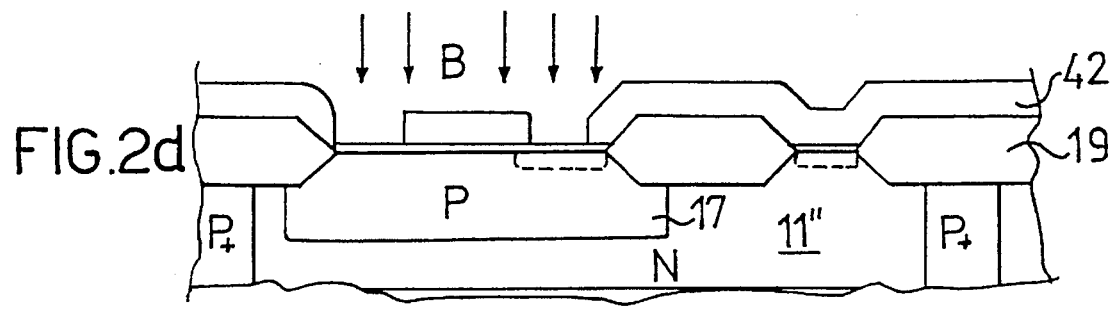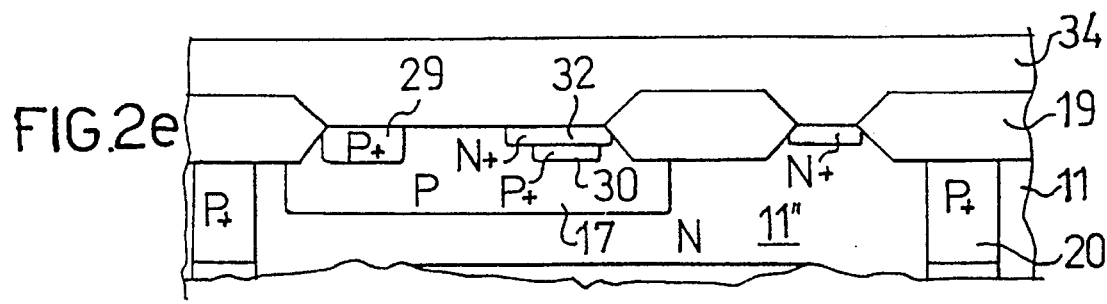

METHOD OF FORMING SEMICONDUCTOR DEVICE WITH A BURIED JUNCTION

TECHNICAL FIELD

This invention relates to semiconductor devices, and in particular, to a structure which includes two regions of opposite conductivity forming a junction and the method of forming the semiconductor device with a buried junction.

BACKGROUND OF THE INVENTION

The present trend toward increased integration has led to designing integrated circuits which include, on a single semiconductor material chip, a large variety of electronic components having structural and functional features which may be widely different from one another. Thus, monolithic structures have been provided, including CMOS (Complementary Metal Oxide Semiconductor) circuits for processing digital signals, bipolar circuits for amplifying analog signals, power components of both the DMOS (Diffused Metal Oxide Semiconductor) and the bipolar types for generating and controlling high voltages and large currents.

Such structures are formed in large numbers on the same semiconductor material slice by means of several successive chemiophysical treatments which include, in a known manner, high-temperature treatments, deposition of insulative and conductive layers, chemical etching, and implantation of dopants.

In view of the fact that each of the above steps contributes to manufacturing faults in varying degrees, and increases the risk of breaking the slice, an important designer's task is to provide the largest possible number of components using minimum variations in the manufacturing process.

In certain cases, a complex integrated circuit may require that buried Zener diodes, high-speed bipolar transistors, field-effect junction transistors, and other components be formed which need a buried region wherein the concentration and/or depth of the impurities can be determined with great accuracy and as independently as possible of variations in the processing parameters. In these cases, specific masking and doping steps are employed, in addition to those already required for the formation of the other integrated circuit components. To avoid these steps, some compromises are occasionally accepted. For instance, in a process for manufacturing an integrated circuit which includes field-effect complementary transistors of the MOS forming the N-type source and drain regions of the N-channel MOS transistors in the CMOS pairs, and a plurality of steps for forming the P-type source and drain regions of the P-channel MOS transistors in the CMOS pairs. In particular, this involves forming a mask to define the source and drain areas of the two transistors, implanting impurities of a first type such as arsenic, implanting impurities of a second type such as boron, and a thermal treatment, possibly in several successive steps to meet specific process requirements, in order to allow the implanted impurities to diffuse and to obtain N and P regions having specified depths and concentrations.

To add Zener-type diodes, i.e., diodes with a predetermined reverse breakdown voltage, to an integrated circuit, a proposal has been made to use in overlapping relationship, the same N and P implants described above, in the same order to form the source and drain regions of the CMOS transistors, based on the fact that boron has a greater coefficient of diffusion through silicon than arsenic. In actual practice, the following operations are performed: the mask that defines the source and drain areas of the N-channel transistors is also apertured to define the areas for the cathode regions of the diodes; arsenic atoms are implanted in the silicon through these apertures in the same way the atoms are implanted through the source and drain apertures; a heating step is carried out at a high temperature to initially diffuse the arsenic atoms; the mask which defines the source and drain areas for the P-channel transistors is also apertured to define areas for doping the anode regions of the diodes within the cathode areas; through these apertures, boron atoms are implanted in the silicon in the same way they are implanted through the source and drain apertures for the P-channel transistors; and finally, a heating step is carried out at a high temperature to further diffuse the arsenic atoms diffuse the boron atoms through the arsenic and underlying silicon until a buried region of the P type, which constitutes the active anode region of the diode is obtained, which forms a junction with the N region which constitutes the cathode region of the diode.

It has been found that the Zener diodes thus obtained have a reverse breakdown voltage which varies within very broad limits, e.g., in the 5 V to 8 V range, due to such uncontrollable process parameters as the thickness of the thin isolation oxide which is usually grown on the silicon surface prior to the boron implantation, the concentration of arsenic atoms in the N region, and the boron implantation energy. In order to reduce this excessive dependence of the breakdown voltage on the process parameters, a proposal has been made to increase the depth of the boron penetration into the N region by increasing the implantation dosage and/or energy. This yields, however, diodes which have a fairly gradual reverse breakdown characteristic due to a marked reverse current contribution from a tunneling effect at a low reverse voltage (2–4 V). Moreover, the source and drain regions of the P-channel transistors, which are formed by the same implantation, generally need to be modified, thereby introducing a deviation from the ideal design parameters of the CMOS pair. Similar problems to the above are encountered where high-speed bipolar transistors or junction field-effect transistors (JFET) are to be formed in the same integrated circuit without adding new process steps.

SUMMARY OF THE INVENTION

It is the object of this invention to provide a method of forming a buried region whose concentration and/or depth is substantially independent of process parameters, and therefore, a junction which has exact and reproducible electrical characteristics.

This object is achieved, according to the invention, by a method as defined and characterized in the first of the appended claims to this specification.

The invention and its advantages can be more clearly understood from the following description of three structures of semiconductor devices obtained with the inventive method. This description should be taken by way of example and not of limitation with reference to the accompanying drawings.

BRIEF DESCRIPTION OF THE DRAWINGS

FIGS. 2a–2e are cross-sectional views showing a portion of the structure in FIG. 1 through successive steps of the present invention.

DETAILED DESCRIPTION OF THE INVENTION

Figure 1:
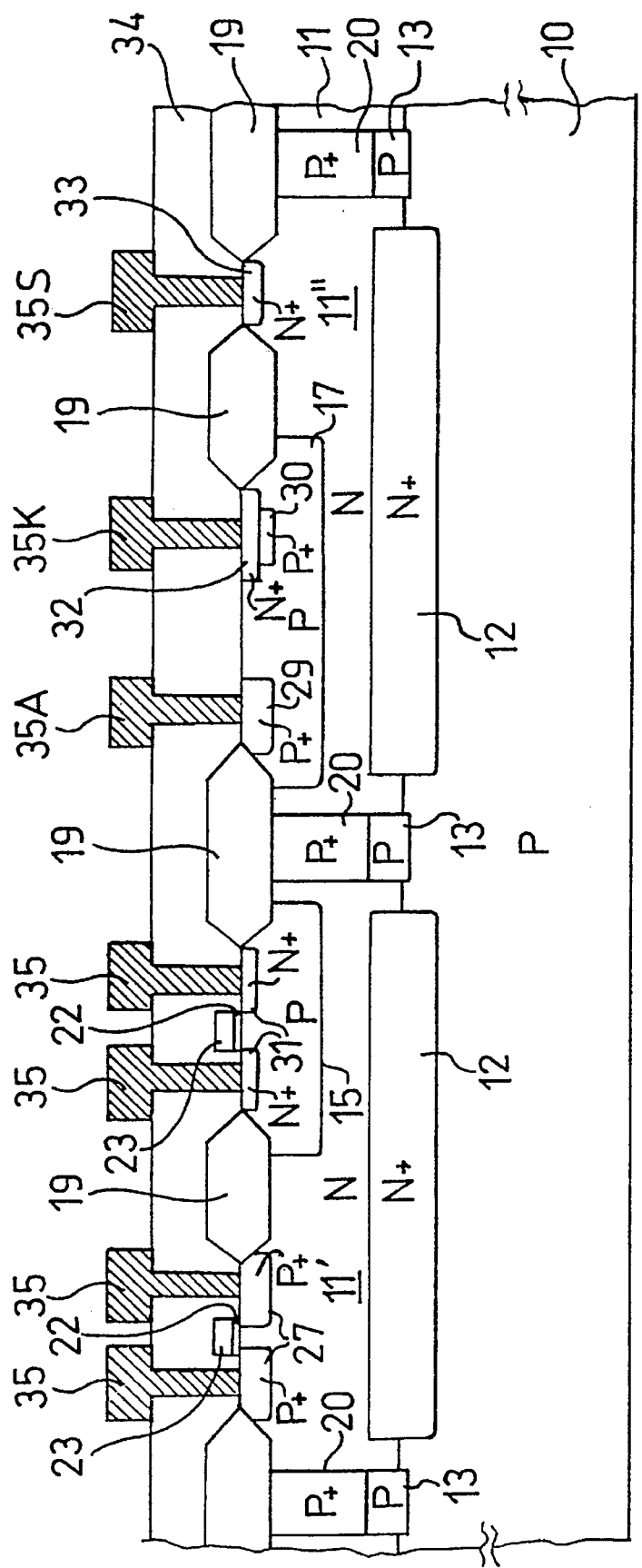
FIG. 1 is a cross-sectional view of a semiconductor material showing a structure which includes a Zener diode obtained according to principles of the present invention.

The main steps of the process for forming the partly conventional structure shown in FIG. 1, are briefly reviewed herein below with reference to FIG. 1.

A substrate 10 of P-type monocrystalline silicon is implanted with impurities of the N type in predetermined areas and impurities of the P type in other predetermined areas;

- a layer of N silicon 11 is grown epitaxially at a high temperature on the substrate 10; during this step, the N- and P-type impurities implanted during the previous step will diffuse to form buried N+ regions 12 and deep isolation P regions 13. The epitaxial layer 11 may be enriched, if necessary, by means of subsequent doping and diffusing steps of N-type impurities;
- areas to be isolated from one another at the surface are defined using a local oxide growing technique (LOCOS);
- impurities of the P-type and the N-type are implanted in selected areas of the epitaxial layer 11;
- silicon dioxide regions 19 are grown at a high temperature using the LOCOS technique, thereby isolating the previously defined area from one another; during this step, P+ regions 20 are formed by diffusion of the impurities implanted in the previous step to complete the isolation regions, while delimiting portions of the epitaxial layer 11 therein, in this example two portions 11' and 11";
- additional P-type regions are formed by implantation followed by diffusion to contain the N-channel transistor of the CMOS pair and the Zener diode, as respectively denoted by 15 and 17; and
- the gate isolators 22 and gate electrodes 23 of the transistors in the CMOS pair are formed from a thin layer of silicon dioxide, as obtained by thermal oxidation of the silicon, and a layer of polycrystalline silicon deposited over the thin oxide layer, respectively.

At this stage, the process is continued according to principles of the present invention which will be described in detail hereinafter with reference to FIGS. 2a to 2e, and which can be summarized as follows:

- in a first doping step, there are formed the source and drain N+ regions 31 for the N-channel transistor in the CMOS pair; a cathode N+ region 32 for the Zener diode; and an N+ region 33 for contacting the area 11" of the epitaxial layer in which the Zener diode is formed; and
- in a second doping step, there are formed the source and drain P+ regions 27 for the P-channel transistor in the CMOS pair; an anode contact region 29 in the containment P region 17 for the Zener diode; and a buried region 30 which forms, together with the cathode N+ region 32, the active junction of the Zener diode.

The process is then continued through the well-known steps for forming an insulating layer and metallic contacts. In particular:

- an insulating layer 34 is formed which is apertured in selected areas for contacting a number of regions of the previously formed components;
- from a metallic layer previously deposited over the insulating layer 34, electrodes are formed in ohmic contact with said selected areas, including the anode 35A and cathode 35K electrodes and an additional electrode 35S of the Zener diode, and electric connection patterns (not shown) are formed between various circuit components; and
- a protective passivation layer and metallic areas for connecting the integrated circuit to external terminals (not shown) are formed.

The principles of the present invention will now be described in detail with reference to FIGS. 2a to 2e. FIG. 2a shows that area of the chip which is to accommodate the Zener diode, as it appears after the containment P region 17 is formed. The surface resistivity of this region, to be obtained by boron implantation and subsequent diffusion, has a value in the 1000 to 3000 ohm/square range, preferably in the 1500 ohm/square range. A photoresist mask 40 extends across the surface of the region 17 to leave an area 36 exposed for accommodating the cathode region, as well as an area 37 for accommodating an additional region of the diode, and extends over the remainder of the structure (not shown in FIG. 2a) to leave but those areas exposed through which impurities of the N-type are to be introduced, specifically the areas intended to accommodate the source and drain regions of the N-channel transistors in the CMOS pairs.

The wafer surface is then subjected to implantation of arsenic ions at a dosage in the $1\times10^{15}$ to $1\times10^{16}$ ions/cm$^2$ range, preferably of $2\times10^{15}$ ions/cm$^2$, and energy of approximately 50 keV. Note that in general, before the masking and implantation steps, it may be convenient to form a thin layer of silicon dioxide over the areas to be implanted.

The mask 40 is then removed, and the wafer is subjected to a thermal treatment, e.g., at 1000° C. for a 20 minute period, to promote an initial diffusion of the arsenic through the silicon until a layer resistivity in the 20 to 60 ohm/square range is obtained. During this step, which is carried out in the presence of oxygen, a thin layer 41 of silicon dioxide forms, e.g., 50 nm thick as shown in FIG. 2b, which also shows in broken lines the N+ regions formed by this initial diffusion.

A further photoresist mask 42 is then formed which leaves a portion of the area 36 and other areas (not shown in FIG. 2c) exposed through which impurities of the P-type are to be introduced, in particular the areas for the source and drain regions of the P-channel transistors of the CMOS pairs.

Thereafter, the wafer surface is subjected to a doping operation which is comprised of two successive steps, namely: a first step wherein boron ions (B) at a high dosage and low energy are implanted, as depicted in FIG. 2c, e.g., $1\times10^{15}$ to $5\times10^{15}$ ions/cm$^2$ at 10 to 35 keV, preferably $2\times10^{15}$ at 20 keV, and a second step of boron implantation at a low dosage and high energy, as depicted in FIG. 2d, e.g., $1\times10^{14}$ to $2\times10^{15}$ ions/cm$^2$ at 55 to 100 keV, preferably $1\times10^{15}$ ions/cm$^2$ at 70 keV.

The wafer is then subjected to a further thermal treatment, e.g., at 1000° C. for a 15 minute period, preferably in the course of the operation for reflowing the vapor-phase deposited isolating layer 34 of silicon dioxide, thereby to form the buried P+ region 30, as shown in FIG. 2e.

According to the present invention, the dosages for implantation are selected to avoid a compensation, or even a reversal, in the conductivity of the N+ region obtained by implantation and diffusion of arsenic. In particular, the first implanting step is adjusted to provide the layer resistivity sought and, hence, a low contact resistance in those areas where a ohmic contact is to be established between the P+ region and metal for the electrodes, as well as to prevent the formation of the junction. The retarding action of high concentration arsenic atoms on the boron diffusion is utilized for the purpose, so that most of the implanted boron atoms will be confined within the cathode region, which is an inactive region of the diode, that is one that bears no active influence on the production of the reverse breakdown voltage.

On the other hand, the second implantation step, being a high energy one, allows boron atoms to be introduced beyond the implanted and prediffused N+ area. Such atoms are, therefore, unaffected by the retarding action of the high-concentration arsenic atoms during the diffusion, and little affected by the process parameters. Thus, the concentration can be accurately controlled in the P+ region, which is the active region of the diode, to accurately determine the reverse breakdown voltage. As may be appreciated, this is accomplished using no additional masking, since the two implantation steps can be carried out through the one aperture in the same mask that is used to form other integrated circuit components as well, such as the source and drain regions of the P-channel transistor of the CMOS pairs. Note that the two implantations add together here to result in diffused regions which are quite similar to those to be obtained with a single implantation carried out at a dosage equal to the sum of the dosages used in the two implantation steps.

It should be understood, moreover, that the two boron implantation steps may be reversed, to obtain the same result, and if necessary, divided in turn into two or more sub-steps at different dosages and/or energies, in order to better control the concentration and depth of the buried region or to take account of special doping requirements of some regions of the integrated circuit.

As for the additional electrode 35S, it functions to pick up any stray currents arising in the device while in operation. Specifically, note that the N+ region 32 and region 11" respectively constitute the emitter and collector regions of an NPN transistor whose base is formed by the regions 30 and 17. In order to control this transistor, the additional electrode 35S should be biased by connecting it, according to individual applications, to the anode electrode 35A or the cathode electrode 35K or a voltage source of suitable value.

Figure 3:
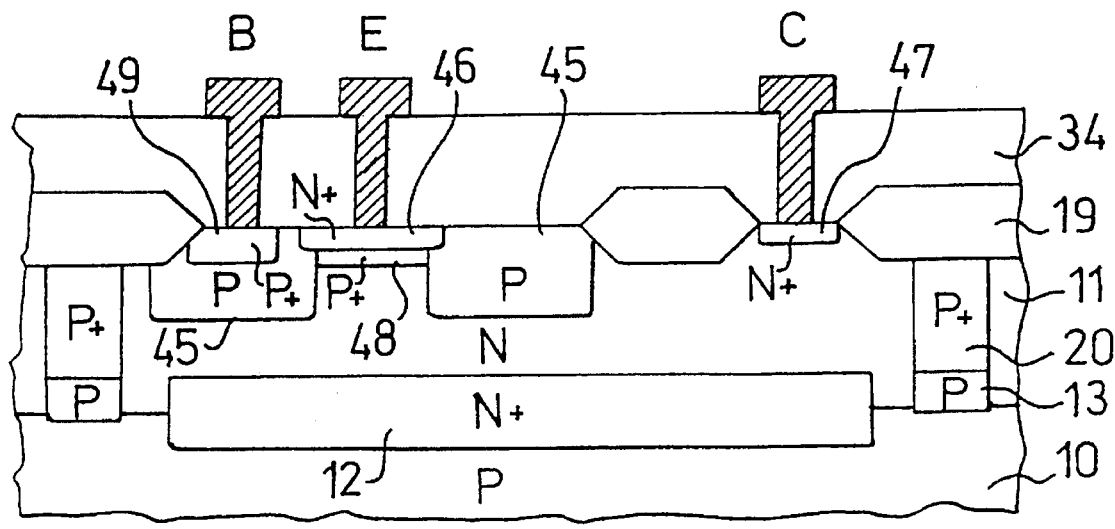
FIGS. 3 and 4 are cross-sectional views respectively showing the structure of a high-speed bipolar transistor of the NPN type and the structure of a junction field-effect transistor (JFET) obtained according to principles of the present invention.

In the embodiment shown in FIG. 3, the principles of the present invention have been used to produce a high-speed bipolar transistor of the NPN type. In this case, the implantation and diffusion steps which result in the containment P region of the N-channel CMOS transistor and the containment region of the Zener diode being formed as shown at 15 and 17, respectively, in FIG. 1, are utilized to form a guard ring 45 in FIG. 3. The operations which result in the formation of the source and drain regions of the N-channel CMOS transistor and the cathode region 31 and 32, respectively, are utilized to form the emitter region 46 and collector contact region 47 of the transistor, and the operations which yield the source and drain regions 27 of the P-channel CMOS transistor, the buried region 30 of the diode, and the diode anode contact region 29 are utilized to provide the buried base region 48 and base contact region 49 of the high-speed NPN transistor. The emitter E, base B and collector C electrodes are formed by the same operations that are carried out to form the other contact electrodes of the integrated circuit.

Figure 4:
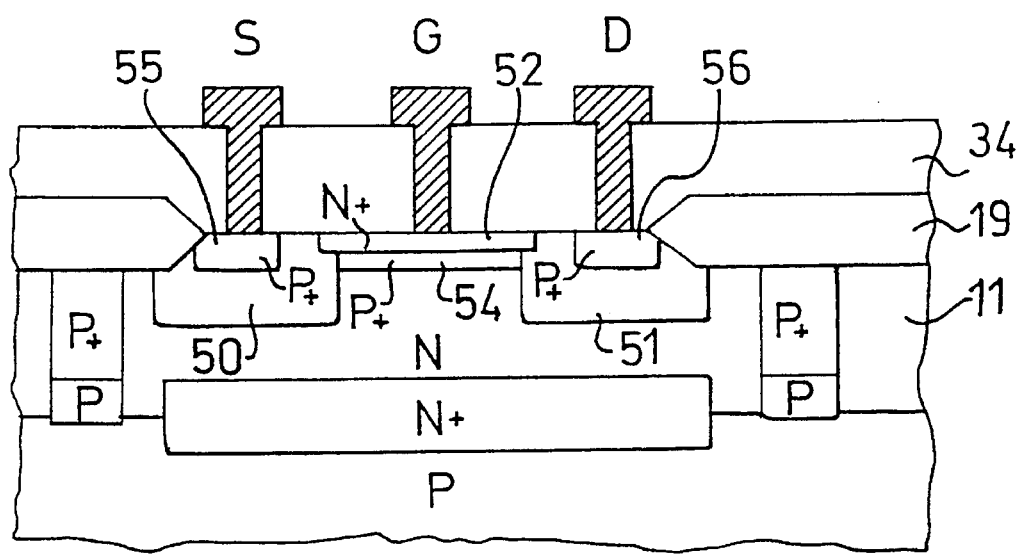

Referring to FIG. 4, the principles of the present invention are used to produce a junction field-effect transistor (JFET). In this case, through the same operations that are carried out to form the region 15 of FIG. 1, two regions, 50 and 51, are obtained which constitute the source and drain regions, respectively, of the JFET transistor; through the same operations that are carried out to form the cathode region 32 of the diode, the gate region 52 is formed; and the same operations that are carried out to form the buried region 30 of the diode in FIG. 1 are also utilized to provide the channel region 54 of the JFET transistor. The source, drain and gate electrodes are denoted by S, D and G, respectively.

It will be appreciated that the base region 48 of the high-speed NPN transistor in FIG. 3 and the channel 54 of the JFET transistor in FIG. 4 can also be formed, for the same reasons as discussed above in connection with the diode of FIG. 1, with the same great accuracy and excellent reproducibility characteristics as the anode region 30 of the diode. However, since the three components have widely different functional characteristics, in some cases the process parameters, in particular the implantation dosages and energies for forming the N+ and P+ regions, once selected to impart optimum characteristics to one of the three components, may not be appropriate to ensure the same optimum characteristics for the other two components. In such cases, therefore, said parameters would have to be adjusted for an acceptable compromise.

While only three possible embodiments of the present invention have been described hereinabove, it should be understood that this method could also be used for other applications, namely, to produce any components requiring that a buried junction of the same kind as described be formed in a highly accurate and reproducible manner. It should also be understood that this method may not only be used to provide a buried region of the P-type forming a junction with an N-region but also—by appropriate selection of the dopant species and implantation dosages and energies—to form junctions between a buried region of the N-type and a P-region. Accordingly, the scope of the present invention is not limited to the foregoing specification, but instead is given by the appended claims along with their full range of equivalents.

We claim:

1. A method for forming, on a chip of semiconductor material, a structure which includes a first region having conductivity of a first type bounded by a major surface of the chip and a second region having conductivity of a second type, being buried in the chip and forming a junction with the first region, which method comprises:

a first doping step for introducing impurities of a first type into an area of the major surface of the chip;

a second doping step for introducing impurities of a second type into a portion of said area; and a high-temperature treatment step for diffusing the impurities introduced by the first and second steps through the chip, thereby forming said first and second regions; and is characterized in that the second doping step is carried out after the first doping step and comprises at least one sub-step of implanting impurities of the second type at a first dosage and low energy, and at least one sub-step of implanting impurities of the second type at a second dosage lower than the first dosage and high energy; the implantation impurities, dosages and energies being selected such that the type of conductivity of the first region is neither compensated nor reversed, and such that the concentration of impurities in the second region is substantially due to the second dosage, high energy implantation sub-step only.

2. A method according to claim 1 wherein the high-temperature thermal treatment step comprises a first high-temperature treatment step subsequent to the first doping step and preceding the second doping step, and a second high-temperature treatment step following the second doping step.

3. A method according to claim 1 wherein the second doping step and the high-temperature treatment step are also utilized to form a third region with conductivity of the second type bounded by the major surface of the chip and separated from the first region;

wherein, prior to the first and second doping steps, a containment region with conductivity of the second type is formed which is bounded by the major surface of the chip and adapted to contain said first, second and third regions; and wherein first and second electrodes are formed in ohmic contact with the chip surface, in the first and third regions thereof, respectively, to provide terminals of a diode having a reverse breakdown voltage.

4. A method according to claim 3, wherein said containment region is formed in a chip region with conductivity of the first type;

wherein the first doping step and the high-temperature treatment step are also utilized to form a fourth region with conductivity of the first type bounded by the major surface of the chip and separated from the containment region; and wherein a third electrode is formed in ohmic contact with the chip surface in the fourth region thereof.

5. A method according to claim 1 wherein, prior to the first and second doping steps, a guard region with conductivity of the second type is formed which is bounded by the major surface of the chip surrounding the first region and contacting the second region;

wherein the second doping step and high-temperature treatment step are also utilized to form a first contact region bounded by the major surface of the chip and located inwards of the guard region;

wherein the first doping step and the high-temperature treatment step are also utilized to form a second contact region with conductivity of the first type bounded by the major surface of the chip and separated from the guard region; and wherein electrodes are formed in ohmic contact with the chip surface in the first region, the first contact region, and the second contact region forming the emitter, base and collector terminals, respectively, of a bipolar transistor.

6. A method according to claim 1 wherein, prior to the first and second doping steps, two regions with conductivity of the second type are formed which are bounded by the major surface of the chip, along two opposed sides of the first region and in contact with the second region;

wherein the second doping step and the high-temperature treatment step are also utilized to form two contact regions bounded by the major surface of the chip, each in one of said two regions on the first region sides; and wherein electrodes are formed in ohmic contact with the chip surface in the first region thereof, and in each of the contact regions forming the gate, source and drain terminals, respectively, of a junction field-effect transistor.

7. A method of forming a junction in a semiconductor material comprising:

forming a first region of the semiconductor material with impurities of a first conductivity type; and after the first region is formed, forming a second region of the semiconductor material under the first region with first and second portions of impurities of a second conductivity type, the second portion being smaller than the first portion, the step of forming a second region including implanting the first portion of impurities at low energy through the first region without changing the conductivity type of the first region;

implanting the second portion of impurities at high energy through the first region such that a substantial portion of the second portion of impurities passes through the first region and reaches the second region; and heating the second region to diffuse the implanted impurities therein.

8. The method according to claim 7, after the step of forming a first region, further including heating the first region to diffuse the first conductivity type impurities therein.

9. The method according to claim 8 wherein the step of heating the first region involves heating in the presence of oxygen to form an insulating layer over the first region.

10. The method according to claim 7, further comprising:

prior to forming a first region, forming a containment region with a second conductivity type for containing the first region and the second region;

while performing the step of forming a second region, forming a third region with impurities of the second conductivity type in the containment region;

forming a first electrode on the first region; and forming a second electrode on the third region, the first and second electrodes reverse breakdown voltage.

11. The method according to claim 10, further comprising:

forming a second containment region with a first conductivity type adjacent to the containment region containing the first, second and third regions;

while performing the step of forming a first region, forming a fourth region with the first conductivity type in the second containment region; and forming a third electrode on the fourth region.

12. The method according to claim 7, further comprising:

prior to forming a first region, forming a guard region with the second conductivity type, the guard region surrounding the first region and contacting the second region;

while performing the step of forming a second region, forming a third region with impurities of the second conductivity type in the guard region; and while performing the step of forming a first region, forming a fourth region with the first conductivity type, the fourth region being separated from the guard region, wherein the first, third and fourth regions respectively define an emitter region, a base contact region and a collector contact region of a bipolar transistor.

13. The method according to claim 7, further comprising the steps of:

prior to forming a first region, forming a third region and a fourth region of the second conductivity type, wherein the first and second regions are formed between the third region and the fourth region, and the second region contacts the third and fourth regions; and while performing the step of forming a first region, forming a fifth region of the second conductivity type in the third region, and forming a sixth region of the second conductivity type in the fourth region, wherein the first region, the third region and the fourth region respectively define a gate region, a source region and a drain region of a junction field-effect transistor.

* * * * *

UNITED STATES PATENT AND TRADEMARK OFFICE
CERTIFICATE OF CORRECTION

PATENT NO.    :   5,605,851
DATED         :   February 25, 1997
INVENTOR(S)   :   Michele Palmieri and Riccardo Depetro It is certified that error appears in the above identified patent and that said Letters Patent is hereby corrected as shown below:

In column 8, claim 10, line 39, following "electrode" please insert --defining terminals of a diode having a--.

Signed and Sealed this

Twenty-fourth Day of February, 1998

Attest:

BRUCE LEHMAN

*Attesting Officer*    *Commissioner of Patents and Trademarks*